US006664870B2

(12) United States Patent
Lampen et al.

(10) Patent No.: US 6,664,870 B2
(45) Date of Patent: Dec. 16, 2003

(54) COMPACT 180 DEGREE PHASE SHIFTER

(75) Inventors: James Lampen, Medway, MA (US); Jaiyoung Park, Lowell, MA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 10/021,231

(22) Filed: Oct. 30, 2001

(65) Prior Publication Data

US 2003/0080829 A1 May 1, 2003

(51) Int. Cl.[7] .................................................. H01P 1/18
(52) U.S. Cl. ........................ 333/164; 333/174; 333/104
(58) Field of Search ................................ 333/164, 174, 333/103, 101, 104, 262

(56) References Cited

U.S. PATENT DOCUMENTS

| | | | | |
|---|---|---|---|---|
| 3,546,636 A | * | 12/1970 | Di Pizza ..................... | 333/164 |
| 4,480,338 A | * | 10/1984 | Dobrovolny ............. | 455/188.1 |
| 4,733,203 A | | 3/1988 | Ayasli ......................... | 333/139 |
| H000954 H | * | 8/1991 | Lang et al. ................. | 333/164 |
| 5,039,873 A | * | 8/1991 | Sasaki ......................... | 327/237 |
| 5,317,290 A | * | 5/1994 | Jacomb-Hood ............. | 333/164 |
| 5,392,010 A | * | 2/1995 | Nakahara .................... | 333/161 |
| 5,701,107 A | * | 12/1997 | Kasahara et al. ........... | 333/164 |
| 5,751,185 A | * | 5/1998 | Yamamoto et al. ......... | 327/558 |
| 6,281,762 B1 | * | 8/2001 | Nakao et al. ................ | 333/103 |

FOREIGN PATENT DOCUMENTS

JP        11205086        7/1999

OTHER PUBLICATIONS

Marc E. Goldfarb, PE, (A Novel Design for A MMIC 180 Degree Phase Shifter), IEEE 1992 Microwave and Millimeter–Wave Monolithic Circuits Symposium pp. 141–143.

* cited by examiner

Primary Examiner—Benny Lee
Assistant Examiner—Kimberly E Glenn
(74) Attorney, Agent, or Firm—Daly, Crowley & Mofford, LLP

(57) ABSTRACT

A phase shifter for changing the phase of a signal fed thereto. The phase shifter includes an inductive reactance element and a capacitive reactance element having one electrode connected to either the input or the output port and a pair of switching elements. A first switching element thereof switches between a conducting state and a non-conductive state when the control signal changes from a first logic state to a second logic state while a second switching element thereof switches between a non-conducting state and a conductive state when the control signal changes from the first logic state to the second logic state.

13 Claims, 3 Drawing Sheets

COMPACT 180 DEGREE PHASE SHIFTER

TECHNICAL FIELD

This invention relates generally to phase shifters and more particularly to compact 180 degree phase shifters.

BACKGROUND

As is known in the art, phase shifters have a wide range of applications. For example, one such application is with radio frequency signals where the phase shifter provides a selective phase shift to a signal propagating therethrough. More particularly, as is known in the art, phase shifters are employed in various radio frequency (r.f) applications such as phased array antenna systems. One type of phase shifter, a passive phase shifter 10 is shown in FIG. 1 and includes passive elements which provide a phase lag and a phase lead network and includes a pair of signal paths provided between an input terminal RF IN and an output terminal RF OUT with the upper one of the signal paths being through a high pass filter 14 to provide phase lead or positive phase shift to a signal and the lower one of the signal paths being through a low pass filter 18 to provide phase lag or negative phase shift to a signal. Typically, a pair of switches 12, 16 are used to couple a signal between the input and output terminals through a selected one of said filter networks. Often, a pair of field effect transistors are arranged to provide active switching elements of each one of said switches. Field effect transistors are employed in these applications because they are easily formed as part of monolithic integrated circuits unlike other types of active switching devices such as pin diodes. Further, with this approach, impedance matching networks (not shown) are generally required at the input and output of each FET. This results in a loss in bandwidth, increased insertion loss and increased complexity and size of the phase shifter circuit.

Other types of phase shifters are described in U.S. Pat. Nos. 5,148,062 inventor Marc E. Goldfarb issued Sep. 15, 1992 and U.S. Pat. No. 4,733,203 inventor Yalcin Ayasil issued Mar. 22, 1988 both assigned to the same assignee as the present invention. While such phase shifters operate satisfactory in many applications, it is desirable that the size of such phase shifters be minimized.

SUMMARY

In accordance with the present invention, a phase shifter is provided for changing the phase of a signal fed thereto. The phase shifter includes a first inductive reactance element and a first capacitive reactance element having one electrode connected to either the input or the output port. The phase shifter includes a first pair of switching elements. A first switching element thereof switches between a conducting state and a non-conductive state when the control signal changes from a first logic state to a second logic state while a second switching element thereof switches between a non-conducting state and a conductive state when the control signal changes from the first logic state to the second logic state. Also provided is a second pair of switching elements. A first switching element thereof switches between a conducting state and a non-conductive state when the control signal changes from a first logic state to a second logic state while a second switching element thereof switches between a non-conducting state and a conductive state when the control signal changes from the first logic state to the second logic state. The phase shifter includes a second inductive reactance element coupled across the first switching element of the first pair of switching elements and a second capacitive reactance element coupled across the second switching element of the second one of the pair of switching elements. The first inductive and first capacitive reacance elements each have a first terminal thereof connected to one of the input and outputs of the circuit. The first inductive reactance has a second terminal thereof connected to a first node and the first capacitive reactance elements has a second terminal thereof connected to a second node. The first switching element of the first pair of switching elements is coupled between the first node and a reference potential and the second switching element of the second pair of switching elements is coupled between the second node and the reference potential. The second switching element of the first pair of switching elements is coupled between the first node and the other one of the input and output ports. The first switching element of the second pair of switching elements is coupled between the second node and said other one of the input and output ports.

In accordance with the invention, a configurable filter is provided. The filter provides high pass filtering between an input port and an output port during a first logic state of a control signal and low pass filtering between the input port and the output port during the second logic state of the control signal. The filter includes first inductive and first capacitive reactance elements along with second inductive and second capacitive reactance elements. The first inductive reactance element and the second capacitive reactance element are connected to a first node and the first capacitive reactance element and the second inductive reactance element are connected to a first node. A switching network is provided. The switching network includes: a first switching element for coupling the first inductive reactance element between the input port and the output port in response to the first logic state of the control signal and for de-coupling the first inductive reactance element from between the input port and the output port in response to the second logic state of the control signal; a second switching element for coupling the first capacitive reactance element between the input port and the output port in response to the second logic state of the control signal and for de-coupling the first capacitive reactance element from between the input port and the output port in response to the first logic state of the control signal; a third switching element for coupling the second capacitive reactance element between the first node and a reference potential during the second logic state of the control signal and for shunting the second capacitive reactance element to couple the first node to the reference potential during the first logic state of the control signal; and a fourth switching element for coupling the second inductive reactance element between the second node and the reference potential during the first logic state of the control signal and for shunting the second inductive reactance element to couple the second node to the reference potential during the second logic state of the control signal.

With such arrangements, a compact phase shifter is provided adapted to change the phase of a signal fed to the input port of such phase shifter 180 degrees as such signal passes through the phase shifter in response to a logic state change in a binary control signal fed to the circuit.

The details of one or more embodiments of the invention are set forth in the accompanying drawings and the description below Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
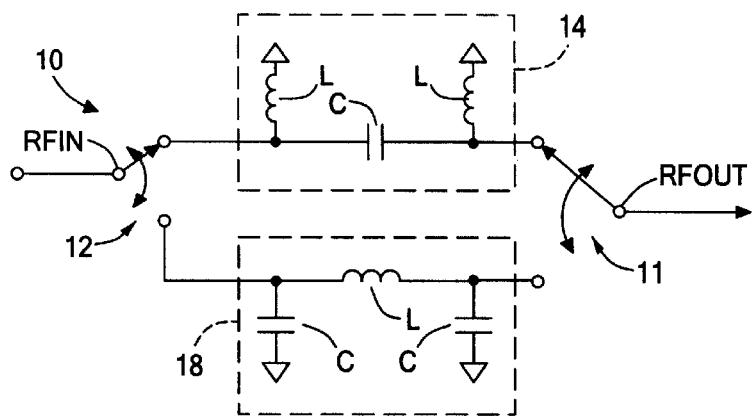
FIG. 1 is a schematic diagram of a reconfigurable filter in accordance with the PRIOR ART.
Figure 2:
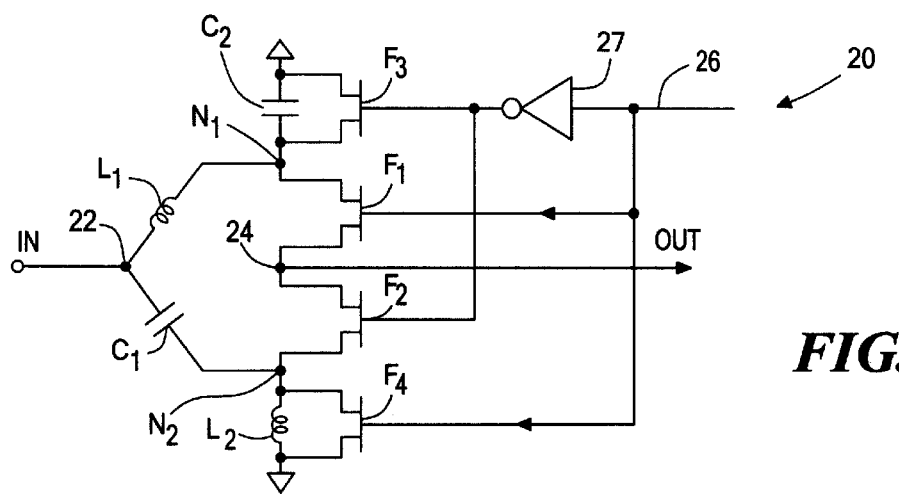
FIG. 2 is a schematic diagram of a reconfigurable filter in accordance with the present invention.

Referring now to FIG. 2, a phase shifter 20 is shown for changing the phase of a signal 180 degrees as such signal passes through the circuit 20 from input port 22 to an output port 24 in response to a logic state change in a binary control signal fed to the circuit on line 26 switches logic state.

The phase shifter 20 includes a first inductive reactance element L1, here for example an inductor or a length of transmission line, and a first capacitive reactance element C1. The first inductive reactance element L1 and the first capacitive reactance element C1 have one electrode connected to the input port 22 of the circuit 20. In the circuit 20' shown in FIG. 5, the inductive reactance element L1 and the capacitive reactance element C1 have one electrode connected to the output port 24 of the circuit 20.

In both circuits 20, 20', the phase shifter includes a first pair of switching elements F1, F3, here field effect transistors. The signal fed to the phase shifter 20 is an r.f. signal. The circuit shown in FIG. 2 is the a-c equivalent circuit it being understood that proper dc biasing circuitry not shown would be included for the field effect transistors used in the circuit 20, 20'.

A first switching element of the first pair of switching elements, here for example a field effect transistor switch F3 switches between a conducting state and a non-conductive state when the control signal changes from a first logic state here a logic 1 to a second logic state here a logic 0 while, because of inverter 27, a second switching element of the first pair of switching elements, here a field effect transistor switch F1 switches between a non-conducting state and a conductive state when the control signal changes from the first logic state to the second logic state.

Also provided is a second pair of switching elements F2, F4. A first switching element thereof, here a field effect transistor switch F2, switches between a conducting state and a non-conductive state when the control signal changes from the first logic state to the second logic state while, because of inverter 27, a second switching element thereof, here a field effect transistor switch F4, switches between a non-conducting state and a conductive state when the control signal changes from the first logic state to the second logic state.

Thus, during the first logic state of the control signal on line 26, switches F1 and F4 are open or non-conducting while switches F2 and F3 are closed or conducting. During the second logic state of the control signal on line 26, switches F2 and F3 are open or non-conducting while switches F1 and F4 are closed or conducting.

Figure 3:
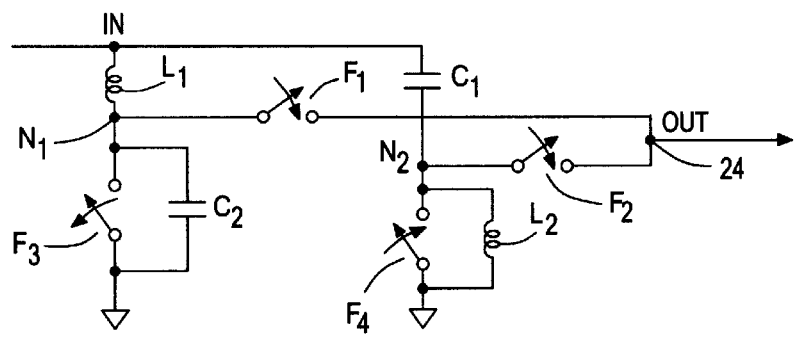
FIG. 3 is an equivalent circuit of the filter of FIG. 2.

The phase shifter includes a second inductive reactance element L2, here, for example, an inductor or length of transmission line, coupled across the second switching element F4 of the second pair of switching elements and a second capacitive reactance element C2 coupled across the first switching element F3 of the first one of the pair of switching elements. The first inductive L1 and first capacitive reactance elements C1 each have a first terminal thereof connected to the input port 22 in circuit 20 (FIG. 2) and the output port 24 in circuit 20' (FIG. 3). The first inductive reactance L1 has a second terminal thereof connected to a first node N1 and the first capacitive reactance element C1 has a second terminal thereof connected to a second node N2. The first switching element F3 of the first pair of switching elements is coupled between the first node N1 and a reference potential, here ac ground and the second switching element F4 of the second pair of switching elements is coupled between the second node N2 and the reference potential, here ac ground, as shown.

Figure 5:
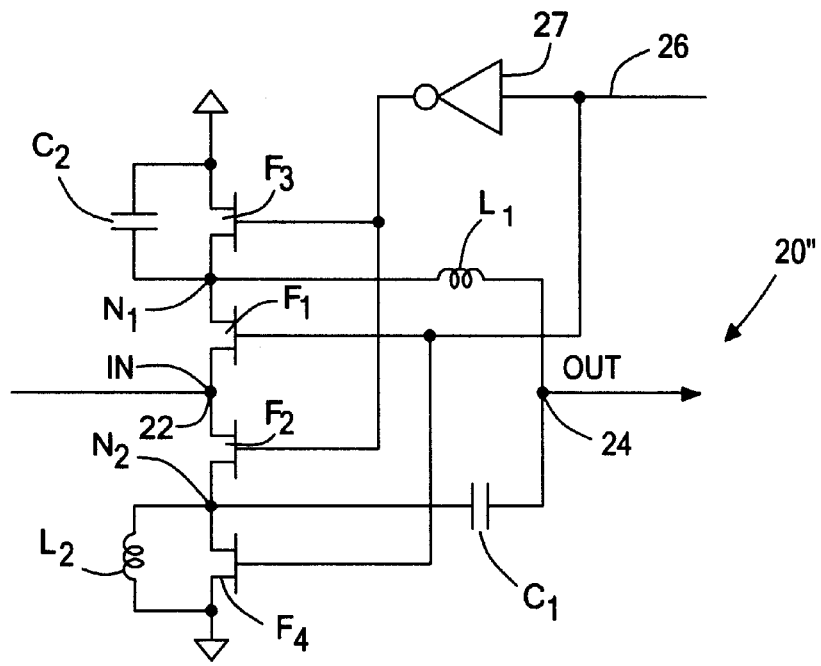
FIG. 5 is a schematic diagram of a reconfigurable filter in accordance with another embodiment of the invention.

The second switching element F1 of the first pair of switching elements is coupled between the first node N1 and the output port 24 for circuit 20 (FIG. 2) and the input port 22 for circuit 20' (FIG. 5). The first switching element F2 of the second pair of switching elements is coupled between the second node N2 and the output port 24 for circuit 20 (FIG. 2) and the input port 22 for circuit 20' (FIG. 5).

Figure 4A:
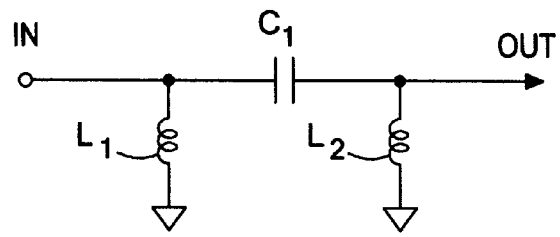
FIG. 4A is a schematic diagram of the filter of FIG. 2 when such filter is configured as a high pass filter.
Figure 4B:
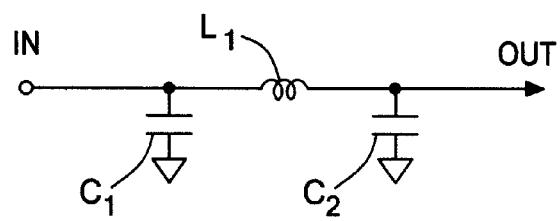
FIG. 4B is a schematic diagram of the filter of FIG. 2 when such filter is configured as a low pass filter.

As noted above, during the first logic state of the control signal on line 26, switches F1 and F4 are open or non-conducting while switches F2 and F3 are closed or conducting. During the second logic state of the control signal on line 26, switches F2 and F3 are closed or conducting while switches F1 and F4 are open or non-conducting. This, during the first logic state of such control signal the filters 20, 22' provide the high-pass filter structure shown in FIG. 4A while during the second logic state of such control signal, the filters 20, 22' provide the low-pass filter structure shown in FIG. 4B. Further, the phase shift of the r.f. signal fed to the input port 22 will change 180 degrees as the control signal on line 26 switches logic state.

Thus, from the above, and referring also to FIG. 3, a reconfigurable filter 20, 20' is provided. The filter 20. 20' provides high pass filtering between the input port 22 and the output port 24 during a first logic state of the control signal on line 26 and low pass filtering between the input port 22 and the output port 24 during the second logic state of the control signal on line 26. The filter 20. 20' includes first inductive and first capacitive reactance elements L1, C1, respectively, along with second inductive and second capacitive reactance elements L2, C2, respectively. The first inductive reactance element L1 and the second capacitive reactance element C2 are connected to the first node N1 and the first capacitive reactance element C1 and the second inductive reactance element L2 are connected to the second node N2. A switching network includes: a first switching element F1 for coupling the first inductive reactance element L1 between the input port 22 and the output port 24 in response to the first logic state of the control signal on line 26 and for de-coupling the first inductive reactance element L1 from between the input port 22 and the output port 24 in response to the second logic state of the control signal on line 26. A second switching element F2 is provided for coupling the first capacitive reactance element C1 between the input port 22 and the output port 24 in response to the second logic state of the control signal on line 26 and for de-coupling the first capacitive reactance element C1 from between the input port 22 and the output port 24 in response to the first logic state of the control signal on line 26. A third switching element F3 is provided for coupling the second capacitive reactance element C2 between the first node N1 and a reference potential, here ac ground, during the second logic state of the control signal on line 26 and for shunting (i.e., short circuiting) the second capacitive reactance element C2 to couple the first node N1 to the reference potential during the first logic state of the control signal on line 26. A fourth switching element F4 is provided for coupling the second inductive reactance element L2 between the second node N2 and the reference potential during the first logic state of the control signal on line 26 and for shunting (i.e., short circuiting) the second inductive reactance element L2 to couple the second node N2 to the reference potential during the second logic state of the control signal on line 26.

Figure 6:
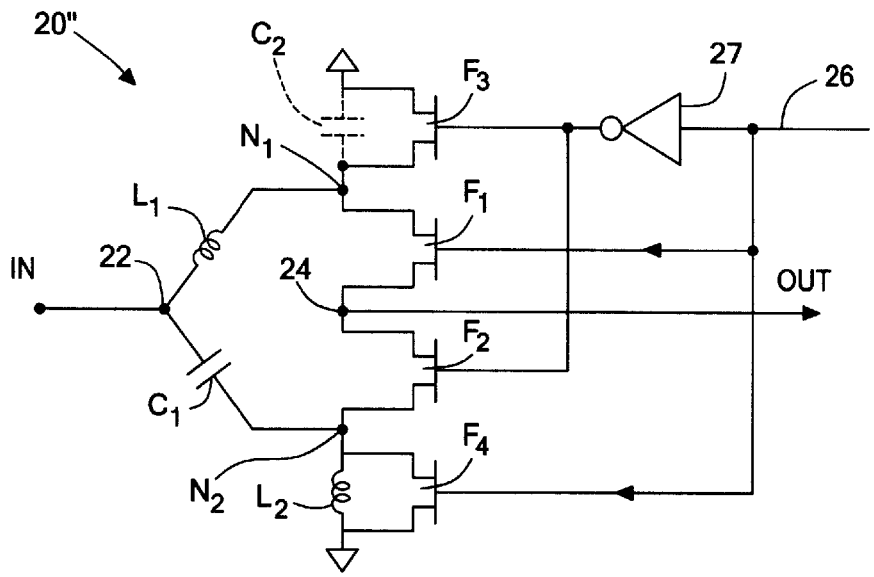
FIG. 6 is a schematic diagram of a reconfigurable filter in accordance with another embodiment of the invention.

Referring now to FIG. 6, a reconfigurable phase shifter 20" according to the invention is shown. Here, instead of having a separate capacitor for the second capacitive reactance element C2 such second reactance element C2 (shown in phantom, i.e., dotted) is provided by the inherent capacitance between the source and drain electrodes of the field effect transistor providing the third switching element F3. Here, the periphery of the transistor is selected to provide the same non-conducting condition capacitance as the capacitor C2.

Figure 7:
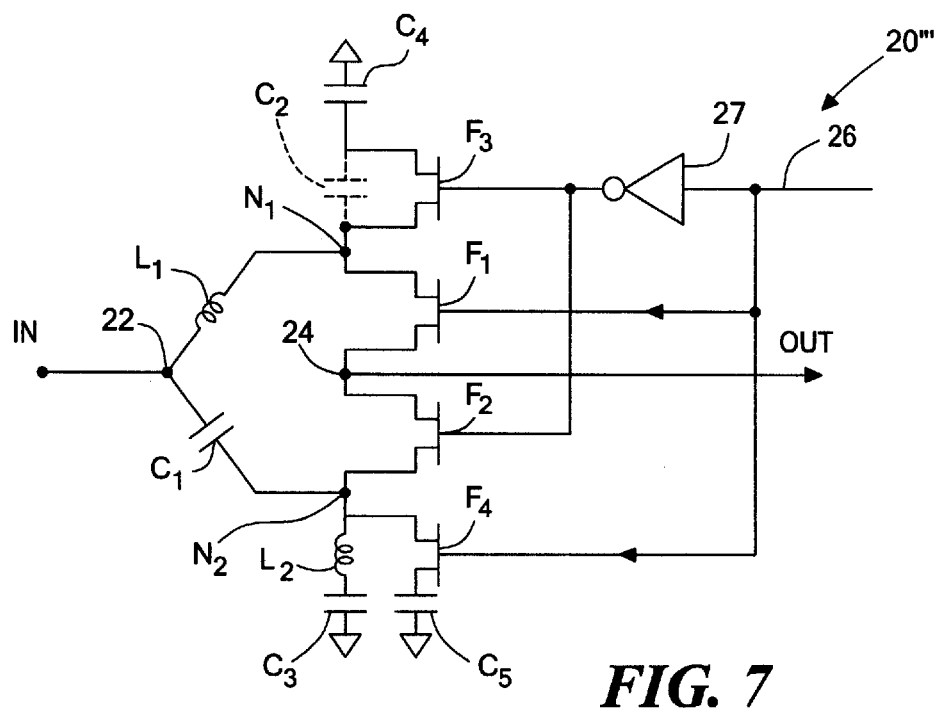
FIG. 7 is a schematic diagram of a reconfigurable filter in accordance with another embodiment of the invention.

Referring now to FIG. 7, a reconfigurable phase shifter 20''' according to the invention is shown. Here, capacitors C3, C4 and C5 are provided as shown where additional tuning capability is desired and/or to float the field effect transistor source and drains at voltages other than ground thereby permitting a greater choice of field effect transistor gate control voltages.

A number of embodiments of the invention have been described. Nevertheless, it will be understood that various modifications may be made without departing from the spirit and scope of the invention. For example, other switching elements than field effect transistors may be used, such as for example PHEMT devices. Accordingly, other embodiments are within the scope of the following claims.

What is claimed is:

1. A phase shifter for changing the phase of a signal fed to an input port of such circuit 180 degrees as such signal passes through the circuit to an output port in response to a logic state change in a binary control signal fed to the circuit, such circuit comprising:
   a first inductive reactance element;
   a first capacitive reactance element;
   a first pair of switching elements, a first switching element of such first pair switching between a conducting state and a non-conductive state when the control signal changes from a first logic state to a second logic state while a second switching element of such first pair of switching elements switches between a non-conducting state and a conductive state when the control signal changes from the first logic state to the second logic state;
   a second pair of switching elements, a first switching element of such second pair switching between a conducting state and a non-conductive state when the control signal changes from a first logic state to a second logic state while a second switching element of such second pair of switching elements switches between a non-conducting state and a conductive state when the control signal changes from the first logic state to the second logic state;
   a second inductive reactance element coupled across the first switching element of the first pair of switching elements;
   a second capacitive reactance element coupled across the second switching element of the second one of the pair of switching elements;
   wherein the first inductive and first capacitive reactance elements each have a first terminal thereof connected to one of the input and output ports of the circuit, the first inductive reactance element has a second terminal thereof connected to a first node and the first capacitive reactance element has a second terminal thereof connected to a second node; and
   wherein the first switching element of the first pair of switching elements is coupled between the first node and a reference potential;
   wherein the second switching element of the second pair of switching elements is coupled between the second node and the reference potential;
   wherein the second switching element of the first pair of switching elements is coupled between the first node and the other one of the input and output ports; and
   wherein the first switching element of the second pair of switching elements is coupled between the second node and said other one of the input and output ports.

2. The filter recited in claim 1 wherein the swiching elements are transistors.

3. The filter recited in claim 2 wherein the transistors are field effect transistors.

4. A configurable filter, such filter providing high pass filtering between an input port and an output port during a first logic state of a control signal and low pass filtering between the input port and the output port during the second logic state of the control signal, such filter comprising:
   a first inductive reactance element;
   a first capacitive reactance element;
   a second inductive reactance element;
   a second capacitive reactance element;
   wherein the first inductive reactance element and the second capacitive reactance element are connected to a first node and the first capacitive reactance element and the second inductive reactance element are connected to a second node;
   a switching network comprising:
      a first switching element for coupling the first inductive reactance element between the input port and the output port in response to the first logic state of the control signal and for de-coupling the first inductive reactance element from between the input port and the output port in response to the second logic state of the control signal;
      a second switching element for coupling the first capacitive reactance element between the input port and the output port in response to the second logic state of the control signal and for de-coupling the first capacitive reactance element from between the input port and the output port in response to the first logic state of the control signal;
      a third switching element for coupling the second capacitive reactance element between the first node and a reference potential during the second logic state of the control signal and for shunting the second capacitive reactance element to couple the first node to the reference potential during the first logic state of the control signal;

a fourth switching element for coupling the second inductive reactance element between the second node and the reference potential during the first logic state of the control signal and for shunting the second inductive reactance element to couple the second node to the reference potential during the second logic state of the control signal.

5. The configurable filter recited in claim 4 wherein the switching elements are transistors.

6. The filter recited in claim 5 wherein the transistors are field effect transistors.

7. The filter recited in claim 3 wherein the second one of the capacitive reactance elements is provided by an inherent capacitive reactance within the one of the transistors providing the third one of the switching elements.

8. The filter recited in claim 7 wherein the transistors are field effect transistors.

9. The filter recited in claim 7 including a first additional capacitor serially coupled between the third switching transistor and the reference potential.

10. The filter recited in claim 7 including a first additional capacitor serially coupled between the fourth switching transistor and the reference potential.

11. The filter recited in claim 7 including a first additional capacitor serially coupled between the second inductive reactance element and the reference potential.

12. The filter recited in claim 11 including a second capacitive reactance element serially coupled between the third switch transistor and the reference potential.

13. The filter recited in claim 12 including third additional capacitive reactance element serially coupled between the fourth switching transistor and the reference potential ect transistors.

* * * * *

UNITED STATES PATENT AND TRADEMARK OFFICE
CERTIFICATE OF CORRECTION

PATENT NO. : 6,664,870 B2
DATED : December 16, 2003
INVENTOR(S) : Lampen et al.

It is certified that error appears in the above-identified patent and that said Letters Patent is hereby corrected as shown below:

Column 1,
Line 39, delete "Nos." and replace with -- No. --.

Column 2,
Line 5, delete "reacance" and replace with -- reactance --.
Line 65, delete "below" and replace with -- below. --.

Column 3,
Line 17, delete "FIG. 75" and replace with -- FIG. 7 --.

Column 4,
Lines 44 and 49, delete "20. 20'" and replace with -- 20, 20' --.

Column 5,
Line 28, delete "20''''" and replace with -- 20" --.
Line 13, delete "element" and replace with -- elements --.
Line 14, delete "potential ect" and replace with -- potential effects --.

Signed and Sealed this

Twenty-second Day of June, 2004

JON W. DUDAS
*Acting Director of the United States Patent and Trademark Office*